(12) United States Patent
Gudem et al.

(10) Patent No.: US 8,433,272 B2
(45) Date of Patent: Apr. 30, 2013

(54) RECONFIGURABLE HIGH LINEARITY LOW NOISE FIGURE RECEIVER REQUIRING NO INTERSTAGE SAW FILTER

(75) Inventors: Prasad S. Gudem, San Diego, CA (US); Jose Cabanillas, San Diego, CA (US); Li-Chung Chang, Irvine, CA (US); Li Liu, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 651 days.

(21) Appl. No.: 12/233,420

(22) Filed: Sep. 18, 2008

(65) Prior Publication Data

US 2009/0258624 A1 Oct. 15, 2009

Related U.S. Application Data

(60) Provisional application No. 61/044,971, filed on Apr. 15, 2008.

(51) Int. Cl.
*H04K 3/00* (2006.01)
*H04B 1/06* (2006.01)
*H04B 7/00* (2006.01)

(52) U.S. Cl.
USPC ...................................... 455/234.1

(58) Field of Classification Search ........... 455/234.1, 455/1, 240.1, 239.1, 132, 133, 134, 135, 455/136, 343.1, 343.2; 330/278, 296
See application file for complete search history.

(56) References Cited

U.S. PATENT DOCUMENTS

| | | | |
|---|---|---|---|
| 5,999,470 A | 12/1999 | Takahashi | |
| 7,130,602 B2 * | 10/2006 | Ciccarelli | ............ 455/240.1 |
| 7,877,072 B2 * | 1/2011 | Wallace et al. | ............ 455/232.1 |
| 2007/0262817 A1 | 11/2007 | Ciccarelli et al. | |
| 2009/0258624 A1 | 10/2009 | Gudem et al. | |

FOREIGN PATENT DOCUMENTS

| | | |
|---|---|---|
| JP | 10050071 A | 2/1998 |
| JP | 2009537111 | 10/2009 |
| WO | WO2004042937 | 5/2004 |
| WO | 2007134197 | 11/2007 |
| WO | WO2007134201 | 11/2007 |

OTHER PUBLICATIONS

International Search Report & Written Opinion—PCT/US2009/040701, International Search Authority—European Patent Office—Jul. 23, 2009.

* cited by examiner

*Primary Examiner* — Ping Y Hsieh
*Assistant Examiner* — Chung-Tien Yang
(74) *Attorney, Agent, or Firm* — S. Hossain Beladi

(57) ABSTRACT

A receiver includes a jammer detector configured to detect the presence or the absence of jamming in a communication signal within a gain state. The receiver further includes an amplifier configured to amplify the communication signal in a high linearity receiving mode or a low linearity receiving mode, wherein the high linearity receiving mode corresponds with a lower gain for the gain state in the amplifier relative to that of the low linearity receiving mode. In addition, the receiver includes a processing unit coupled to the jammer detector, the processing unit being configured to control the amplifier to amplify the communication signal in either the high linearity receiving mode or the low linearity receiving mode, based on the output of the jammer detector detecting the presence or the absence of jamming in the communication signal. A method is also provided for processing a communication signal in a receiver.

40 Claims, 13 Drawing Sheets

RECONFIGURABLE HIGH LINEARITY LOW NOISE FIGURE RECEIVER REQUIRING NO INTERSTAGE SAW FILTER

This application is related to and claims priority from U.S. Provisional Patent Application Ser. No. 61/044,971 filed Apr. 15, 2008, for METHOD AND APPARATUS FOR PROCESSING A COMMUNICATION SIGNAL IN A RECEIVER.

BACKGROUND

1. Field

The present invention relates to electronic devices and communications, and more particularly, to a method and apparatus for processing a communication signal in a receiver.

2. Background

Noise figure (NF) and linearity are characteristics of receivers, and can be used to specify the performance of receivers. NF is a measure of the degradation of a signal to noise ratio (SNR), caused by components in a communication signal chain. More specifically, NF is the ratio of the output noise power of a device to the portion thereof attributable to thermal noise in the input termination at standard noise temperature $T_0$ (e.g., 290° K.). In other words, NF is the ratio of actual output noise to that which would remain if the device itself did not introduce noise. It is a number by which the performance of a radio receiver can be specified.

The linearity of a receiver, on the other hand, can be characterized by the input-referred third-order intercept point (IIP3). Typically, an output communication signal (e.g., RF signal) and third-order intermodulation products are plotted versus the input communication signal (e.g., RF signal). As the input communication signal is increased, the IIP3 is a theoretical point where the desired output communication signal and the third-order products become equal in amplitude. The IIP3 is an extrapolated value since the active device typically goes into compression before the IIP3 point is reached.

In cellular applications, it is common to have more than one communication system operating within the same geographic coverage area. Furthermore, these systems can operate at or near the same frequency band. When this occurs, the transmission from one system can cause degradation in the received signal of another system. For example, CDMA is a spread spectrum communication system which spreads the transmit power to each user over the entire 1.2288 MHz signal bandwidth. The spectral response of an FM-based transmission can be more concentrated at the center frequency. Therefore, FM-based transmission can cause jamming to appear within the allocated CDMA band and very close to the received communication signal. Furthermore, the amplitude of the jamming can be many times greater than that of the communication signal. This jamming can cause third-order intermodulation products, which can degrade the performance of the CDMA system.

To minimize degradation due to intermodulation products caused by jamming, the receiver can be designed to have high IIP3. However, design of a high IIP3 receiver typically requires the active devices within the receiver to be biased with high DC current, thereby consuming large amounts of power. This design approach is undesirable for cellular application wherein the receiver is a portable unit powered by a battery and power is limited.

Thus, a receiver with improved linearity and noise figure, and reduced power consumption is desired.

SUMMARY

In one aspect of the disclosure, a receiver is provided. The receiver includes a jammer detector configured to detect the presence or the absence of jamming in a communication signal within a gain state. The receiver further includes an amplifier configured to amplify the communication signal in a high linearity receiving mode or a low linearity receiving mode, wherein the high linearity receiving mode corresponds with a lower gain for the gain state in the amplifier relative to that of the low linearity receiving mode. In addition, the receiver includes a processing unit coupled to the jammer detector, the processing unit being configured to control the amplifier to amplify the communication signal in either the high linearity receiving mode or the low linearity receiving mode, based on the output of the jammer detector detecting the presence or the absence of jamming in the communication signal.

In a further aspect of the disclosure, a method for processing a communication signal in a receiver is provided. The method includes detecting the presence or the absence of jamming in the communication signal within a gain state. The method further includes amplifying the communication signal in either a high linearity receiving mode or a low linearity receiving mode, based on the output of detecting the presence or the absence of jamming in the communication signal. The high linearity receiving mode corresponds with a lower gain for the gain state relative to that of the low linearity receiving mode.

In yet a further aspect of the disclosure, an apparatus for processing a communication signal in a receiver is provided. The apparatus includes means for detecting the presence or the absence of jamming in the communication signal within a gain state. The apparatus further includes means for amplifying the communication signal in either a high linearity receiving mode or a low linearity receiving mode, based on the output of detecting the presence or the absence of jamming in the communication signal. The high linearity receiving mode corresponds with a lower gain for the gain state relative to that of the low linearity receiving mode.

In yet a further aspect of the disclosure, a processing system for processing a communication signal in a receiver is provided. The processing system includes a module configured to detect the presence or the absence of jamming in the communication signal within a gain state. The module is further configured to amplify the communication signal in either a high linearity receiving mode or a low linearity receiving mode, based on the output of detecting the presence or the absence of jamming in the communication signal. The high linearity receiving mode corresponds with a lower gain for the gain state relative to that of the low linearity receiving mode.

In yet a further aspect of the disclosure, a machine-readable medium encoded with instructions for processing a communication signal in a receiver is provided. The instructions include code for amplifying the communication signal in either a high linearity receiving mode or a low linearity receiving mode, based on a detection of the presence or the absence of jamming in the communication signal within a gain state. The high linearity receiving mode corresponds with a lower gain for the gain state relative to that of the low linearity receiving mode.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

Figure 1:
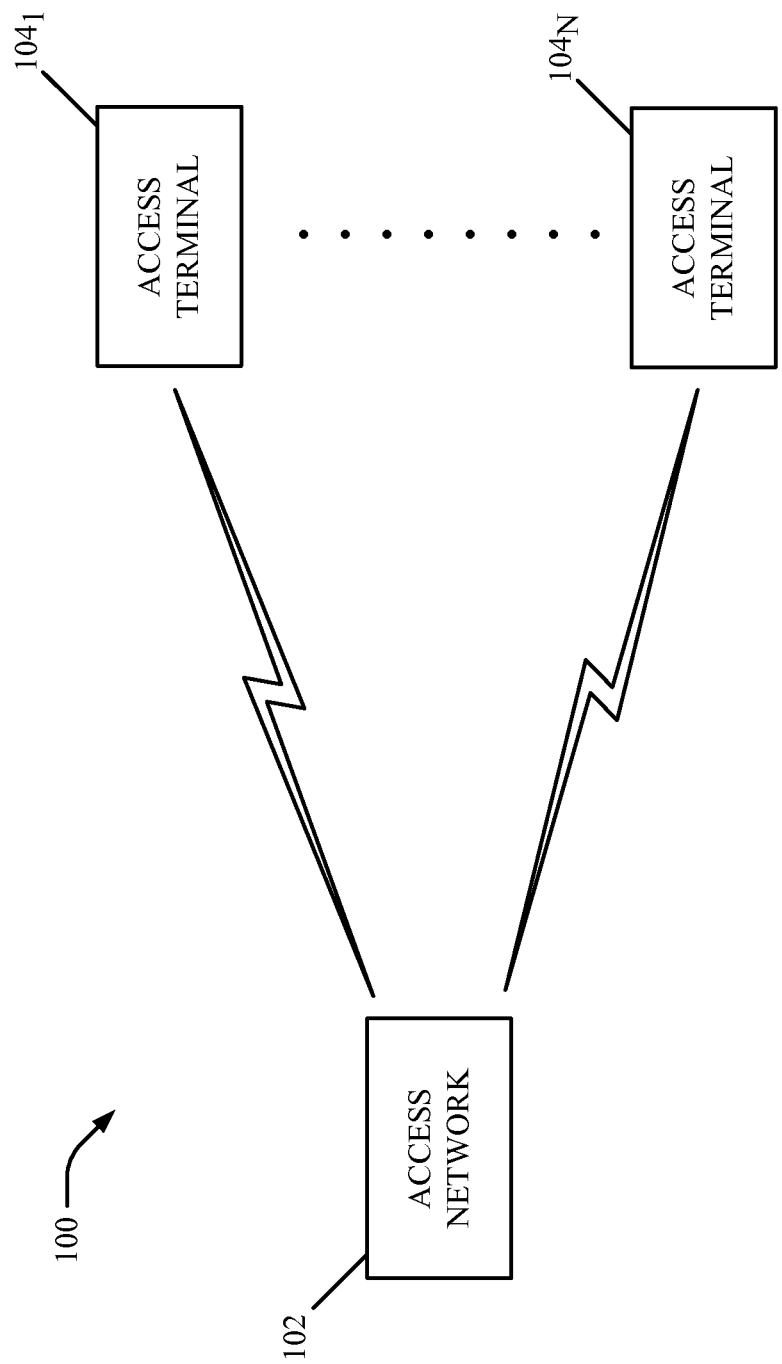
FIG. 1 is a diagram illustrating an example of a wireless communication system in which a receiver can be used.

FIG. 1 is a diagram illustrating an example of a wireless communication system in which a receiver can be used. Wireless communication system 100 includes an access network 102 which can communicate with multiple access terminals $104_1$ to $104_N$. Access terminals $104_1$ to $104_N$ can also communicate with each other via access network 102. A communication link from the access network to one of access terminals $104_1$ to $104_N$ is typically referred to as a forward link, and a communication link from one of access terminals $104_1$ to $104_N$ to access network 102 is typically referred to as a reverse link.

Any of access terminals $104_1$ to $104_N$ can represent a mobile phone, a computer, a laptop computer, a telephone, a personal digital assistant (PDA), an audio player, a game console, a camera, a camcorder, an audio device, a video device, a multimedia device, a component(s) of any of the foregoing (such as a printed circuit board(s), an integrated circuit(s), and/or a circuit component(s)), or any other device capable of supporting wireless communication. In addition, access terminals $104_1$ to $104_N$ can be stationary or mobile, and can include digital devices, analog devices or a combination of both.

Communication system 100 can correspond with an Ultra-Wideband (UWB) system, which is a radio technology for Wireless Personal Area Networks (WPAN). Communication system 100 may use one of many other communications protocols. By way of example, communication system 100 may support Evolution-Data Optimized (EV-DO) and/or Ultra Mobile Broadband (UMB). EV-DO and UMB are air interface standards promulgated by the 3rd Generation Partnership Project 2 (3GPP2) as part of the CDMA2000 family of standards and employ multiple access techniques such as Code Division Multiple Access (CDMA) to provide broadband Internet access to mobile subscribers. Alternatively, communication system 100 may support Long Term Evolution (LTE), which is a project within the 3GPP2 to improve the Universal Mobile Telecommunications System (UMTS) mobile phone standard based primarily on a Wideband CDMA (W-CDMA) air interface. Communication system 100 may also support the WiMAX standard associated with the WiMAX forum. These are merely exemplary protocols, and communication system 100 is not limited to these examples.

The actual communications protocol(s) employed by communication system 100 will depend on the specific application and the overall design constraints imposed on the system. The various techniques presented throughout this disclosure are equally applicable to any combination of heterogeneous or homogeneous communication protocols, and can be applicable in a wireless or wired communications system or other types of systems or devices.

Figure 2:
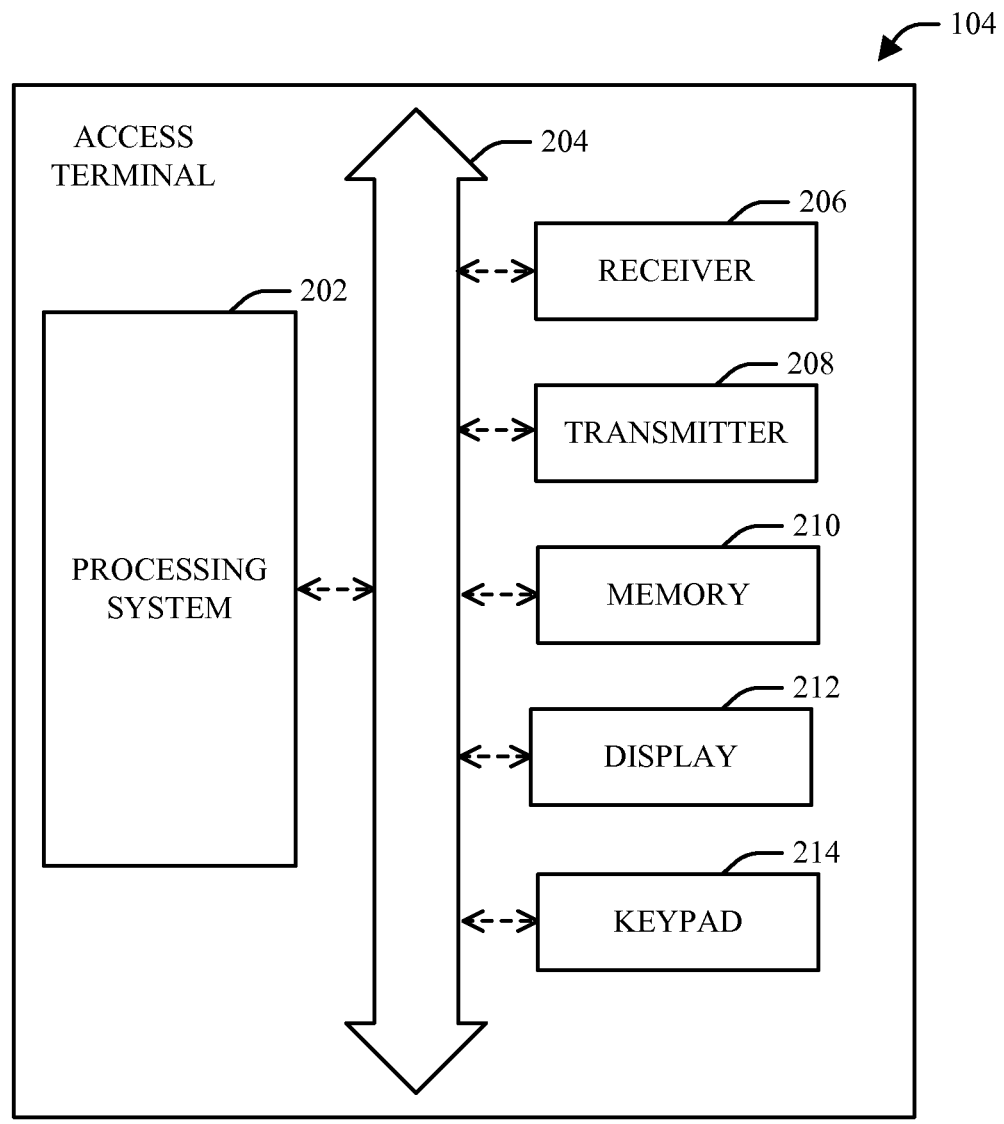
FIG. 2 is a conceptual block diagram illustrating an example of one of the access terminals of FIG. 1.

FIG. 2 is a conceptual block diagram illustrating an example of one of the access terminals of FIG. 1. Access terminal 104 includes a processing system 202 which is capable of communication with a receiver 206 and transmitter 208 through a bus 204 or other structures or devices. It should be understood that communication means other than busses can be utilized with the disclosed configurations. Processing system 202 can generate audio, video, multimedia, and/or other types of data to be provided to transmitter 208 for communication. In addition, audio, video, multimedia, and/or other types of data can be received at receiver 206, and processed by processing system 202.

Processing system 202 may include a general purpose processor and volatile or non-volatile memory for storing data and instructions for software programs. The software programs, which may be stored in memory 210, may be used by processing system 202 to control and manage access to the various networks, as well as provide other communication and processing functions. The software programs may also provide an interface to processing system 202 for various user interface devices, such as a display 212 and a keypad 214. Processing system 202 may also include a digital signal processor (DSP) with an embedded software layer to offload various signal processing functions, such as convolutional encoding, modulation and spread-spectrum processing. The DSP may also perform encoder functions to support telephony applications.

Standards such as the IS-98 standard may have stringent linearity and noise figure specifications for a receiver such as receiver 206. To conform with such specifications, an Rx interstage SAW filter can be used between an LNA and a downconverter in a receiver. This configuration can achieve a low noise figure due to the use of a high gain, low noise amplifier in front of the downconverter. Further, the interstage SAW filter can reduce transmit leakage and relax the linearity requirements of the downconverter. However, the use of a SAW filter typically requires additional cost, board space and pins. Thus, a receiver architecture which provides low noise figure and high-linearity without the use of a SAW filter is desirable.

Figure 3:
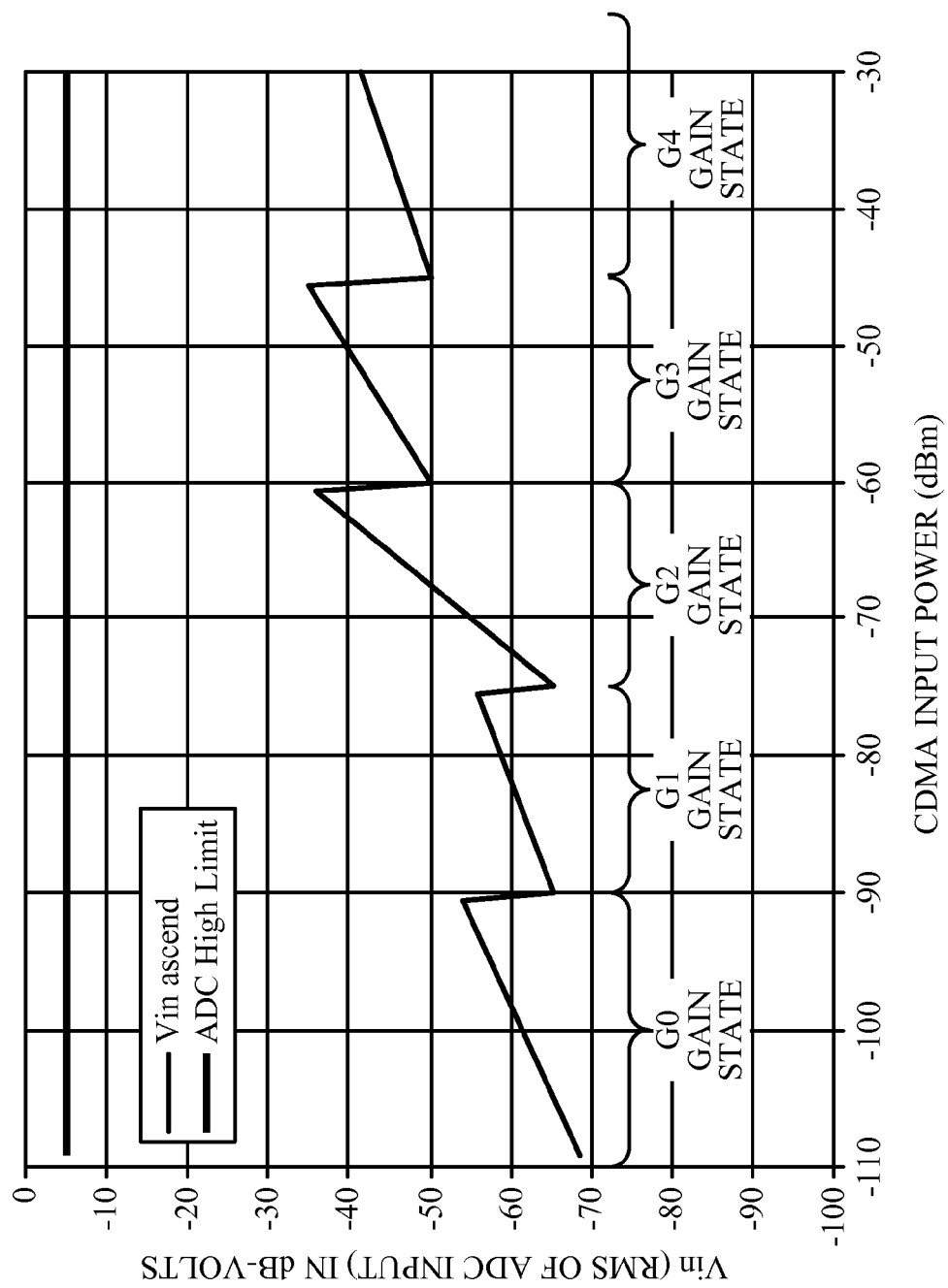
FIG. 3 is a graph illustrating an example of gain transitions when stepping through different gain states.

FIG. 3 is a graph illustrating an example of gain transitions when stepping through different gain states. A receiver (e.g., receiver 206 of FIG. 2) typically has different gain states, which may be referred to as G0, G1, G2, G3. As can be seen in FIG. 3, the receiver gain is typically reduced by ~15 dB in gain transition as when stepping through G0→G1→G2→G3. In this regard, typical gain state voltages for an Rx signal are as follows:

G0: Rx signal is between −110 dBm to −90 dBm
G1: Rx signal is between −90 dBm to −75 dBm
G2: Rx signal is between −75 dBm to −60 dBm
G3: Rx signal is between −60 dBm to −45 dBm
G4: Rx signal >−45 dBm The x axis represents CDMA input power where the receiver receives the input power. The y axis represents the voltage at the output of receiver where the receiver is connected to the analog to digital converter (ADC). Using FIG. 3, if the input power to the receiver is −100 dBm, the voltage at the output of the receiver is −62 dB-volts. When the input power hits −90 dBm, the gain state is changed from G0 to G1. The gain of the amplifier is varied depending on whether jammers are detected or not. It should also be noted that although the figures illustrate the use of G0 (e.g., G0-HL, G0-LL in FIGS. 7 to 10), any other gain state (e.g., G1, G2 or G3) may be used.

Figure 4A:
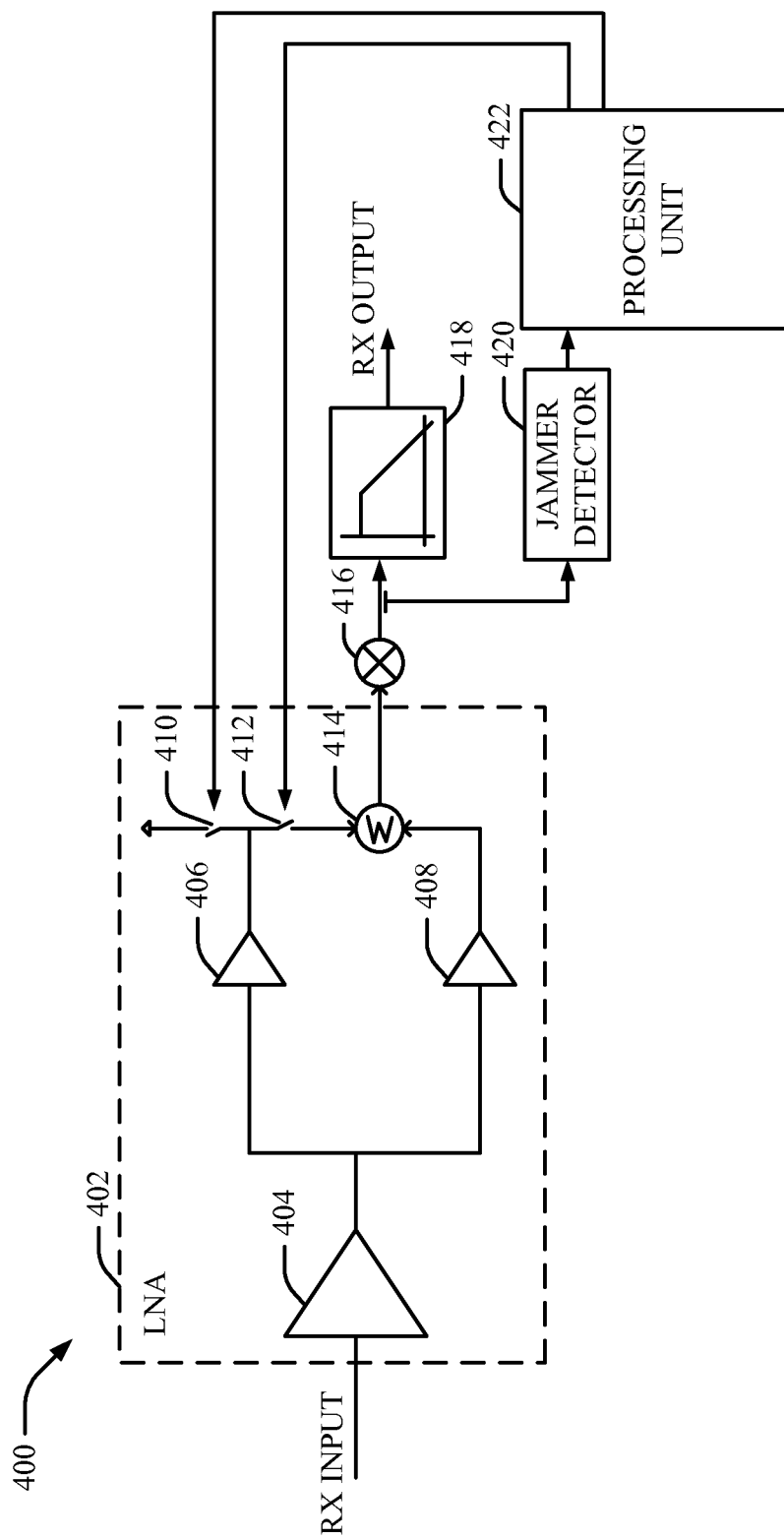
FIG. 4A is a conceptual block diagram illustrating an exemplary receiver system in which a low noise amplifier (LNA) is configured to amplify a communication signal at an output portion of the LNA.

FIG. 4A is a conceptual block diagram illustrating an exemplary receiver system in which a low noise amplifier (LNA) is configured to amplify a communication signal at an output portion of the LNA. The LNA can amplify the communication signal in a low linearity receiving mode or a high linearity receiving mode. According to one configuration of the subject technology, receiver system 400 can correspond with receiver 206 or with access terminal 104 of FIG. 2. It should be noted that receiver system 400 is not limited to receiver 206 or access terminal 104, and can correspond with other types of electronic systems or other types of receivers.

As can be seen in FIG. 4A, LNA 402 includes an amplifier 404 (e.g., high gain amplifier) coupled to current buffers 406 and 408, which are in turn coupled to a combiner 414. Current buffer 406 is also coupled to switches 410 and 412. Amplifier 404 is coupled to the input of LNA 402. Amplifiers 406 and 408 are coupled to the output of LNA 402.

In a high linearity receiving mode, which is based on the presence of a jamming signal (described later), switch 410 is closed and switch 412 is open. This configuration diverts current from current buffer 406 away from combiner 414 through the path provided by closed switch 410, so that only current from current buffer 408 enters combiner 414. This configuration can be seen to correspond with low gain degrading the noise figure (NF) of the receiver (e.g., increasing NF from 3 dB to 5 dB). Thus, low gain (e.g., through use of amplifier 404) and high linearity can be achieved.

In a low linearity receiving mode, which is based on the absence of a jamming signal (described later), switch 412 is closed and switch 410 is open. This configuration directs current from current buffer 406 to combiner 414, so that current from both current buffers 406 and 408 enter combiner 414. Thus, high gain (e.g., through use of both transistor circuits 406 and 408) and low noise figure can be achieved at the expense of low linearity. Thus, low linearity is the tradeoff. (through use of two amplifiers 406 and 408) can be achieved.

Accordingly, the high linearity receiving mode can correspond with low gain and degraded NF, and the low linearity receiving mode can correspond with high gain. Receiver system 400 may have degraded linearity in the absence of jammers, as long as receiver system 400 can achieve low NF. Additionally, receiver system 400 may have degraded NF in the presence of jammers as long as receiver system 400 can achieve high linearity. In other words, low NF and high linearity do not necessarily have to be achieved simultaneously, provided that the presence/absence of jammers can be detected. Thus, because the presence or absence of jammers can be detected, a robust receiver design is not needed. Detecting the presence or absence of jamming in a signal can occur within a gain state, and the high linearity receiving mode can correspond with a lower gain for that gain state relative to that of the low linearity receiving mode.

For example, in the presence of a jammer (corresponding to the high linearity receiving mode), a signal level can be raised from −110 dBm to −90 dBm, while the receiver NF is allowed to increase from 3 dB max to 5 dB max. However, in both the low and high linearity receiving mode, a gain high enough to conform with specifications for certain standards (e.g., IS-98 standard) can still be realized. It should also be noted that controlling transitions between the low and high linearity receiving modes at an input (rather than output) portion of an LNA can take advantage of the relaxed NF, and can improve triple-beat IIP3 (TB_IIP3) of the LNA and the downconverter (DnC) mixer. Using amplifiers at both the input of the LNA 402 (such as 404) and at the output of LNA 402 (such as 406 and 408) allows the controlling of transitions between the low and high linearity receiving modes at both the input and output portions of an LNA 402.

Combiner 414 may be coupled to mixer 416, which is configured to downconvert the communication signal (e.g., RF signal). Mixer 416 may be coupled to baseband filter 418, which is configured to filter the downconverted signal. The baseband signal can correspond to the output (e.g., Rx output) for receiver system 400.

Mixer 416 may also be coupled to jammer detector 420. Jammer detector 420 is configured to detect the presence of jamming in the communication signal. In this regard, "jamming" in the communication signal can correspond with interference in the communication signal. The use of a jammer detector is further described in U.S. Pat. No. 7,130,602, ("the '602 patent") the contents of which are incorporated by reference herein.

Figure 4B:
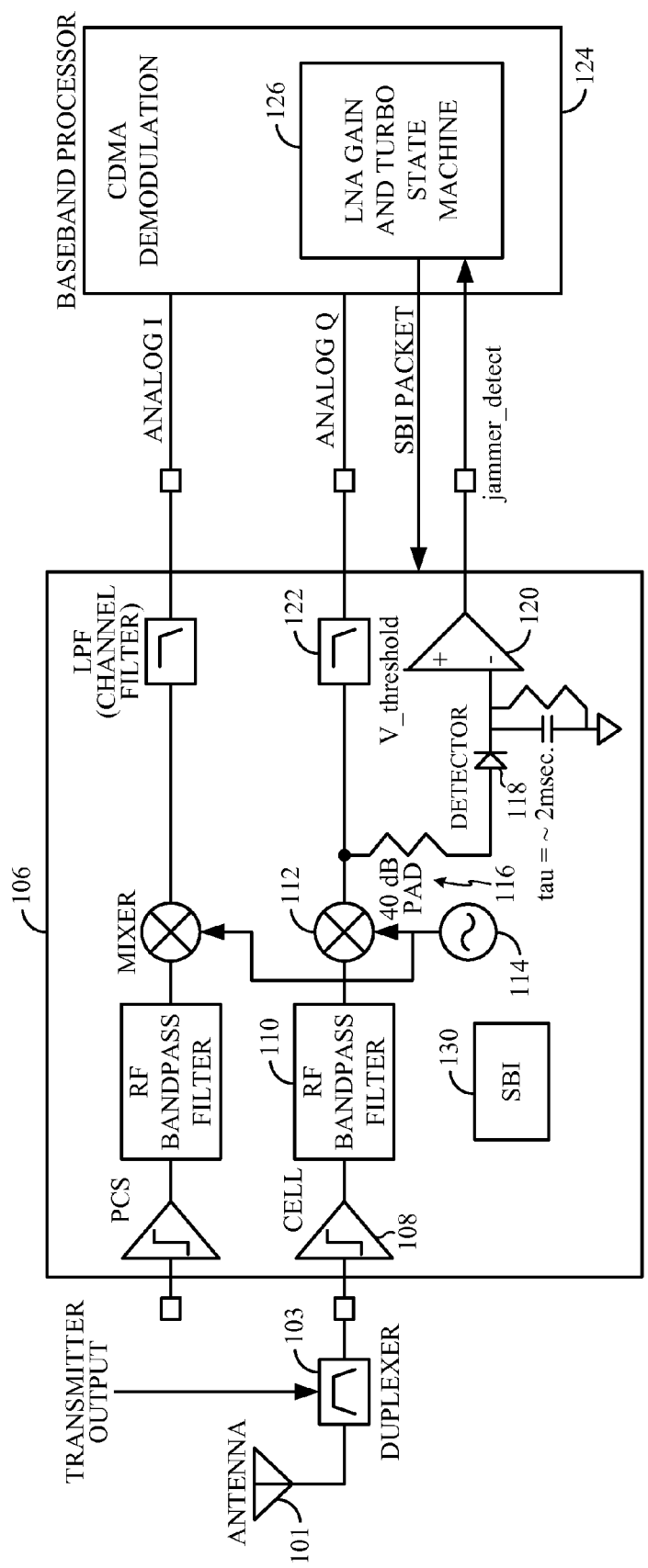
FIG. 4B is a block diagram of an example receiver according to the present disclosure.

For example, FIG. 4B is drawing 1 of the '602 patent and illustrates a portion of a block diagram for a dual-band, quad-mode transceiver, however, according to the present disclosure, the disclosed system and method may be used with any configuration of cellular device, such as CDMA, TDMA, GSM, single band, etcetera, and generally referred to herein as a receiver. The receiver is shown with an antenna 101 coupled to an RF filter. By way of example, the RF filter may be a radio frequency surface acoustic wave (SAW) filter with the output coupled to a chip set 106. Internal of the chip set 106 is a low noise amplifier (LNA), which may be coupled to an adaptive filter 110, but the adaptive filter 110 is not required. The adaptive filter 110 may be a RF bandpass filter. Coupled to the adaptive filter 110 is a mixer 112, with an oscillator 114 coupled to the mixer 112. The output of the mixer may be, by way of example, at approximately 0 Hz. A node branches off of the output of the mixer 112 with a programmable variable attenuator, and the programmable variable attenuator may be, by way of example a 40 dB pad, located after the node but before a jammer detector 118. The output of the jammer detector 118 is coupled to a comparator 120 or to an analog to digital converter with an established voltage threshold. The threshold voltage for the comparator may be, by way of example, a 30 mV for a 40 dB coupling. The programmable variable attenuator eliminates any signal leaking back from the jammer detector 118 to the mixer 112. The output of mixer 112 is also coupled with a low pass filter (LPF) 122. This configuration allows the jammer detector 118 to detect the presence of jamming in an RF signal prior to the LPF 122 filtering the jamming elements out of the RF signal. Interference in an RF signal and in a receiver may be defined as jamming in an RF signal, and the present disclosure utilizes a jammer detector for detecting the presence of jamming in an RF signal.

In FIG. 4B, Jammer detector 420 is coupled to processing unit 422, which can determine whether or not receiver 400 should be in a low linearity receiving mode or a high linearity receiving mode. As noted above, the presence of jamming in the communication signal can be used as a basis for which linearity receiving mode (high or low) LNA 402 will use. In particular, LNA 402 can be in a high gain, low linearity receiving mode when jamming is detected, or in a low gain, high linearity receiving mode when jamming is not detected. Processing unit 422 can make the determination and can control transitions between the modes based on the output of jammer detector 420.

According to one configuration of the subject technology, processing unit 422 can be a digital signal processor (DSP). In addition, processing unit 422 can correspond with at least part of processing system 202, or can correspond with a separate processor.

Figure 5:
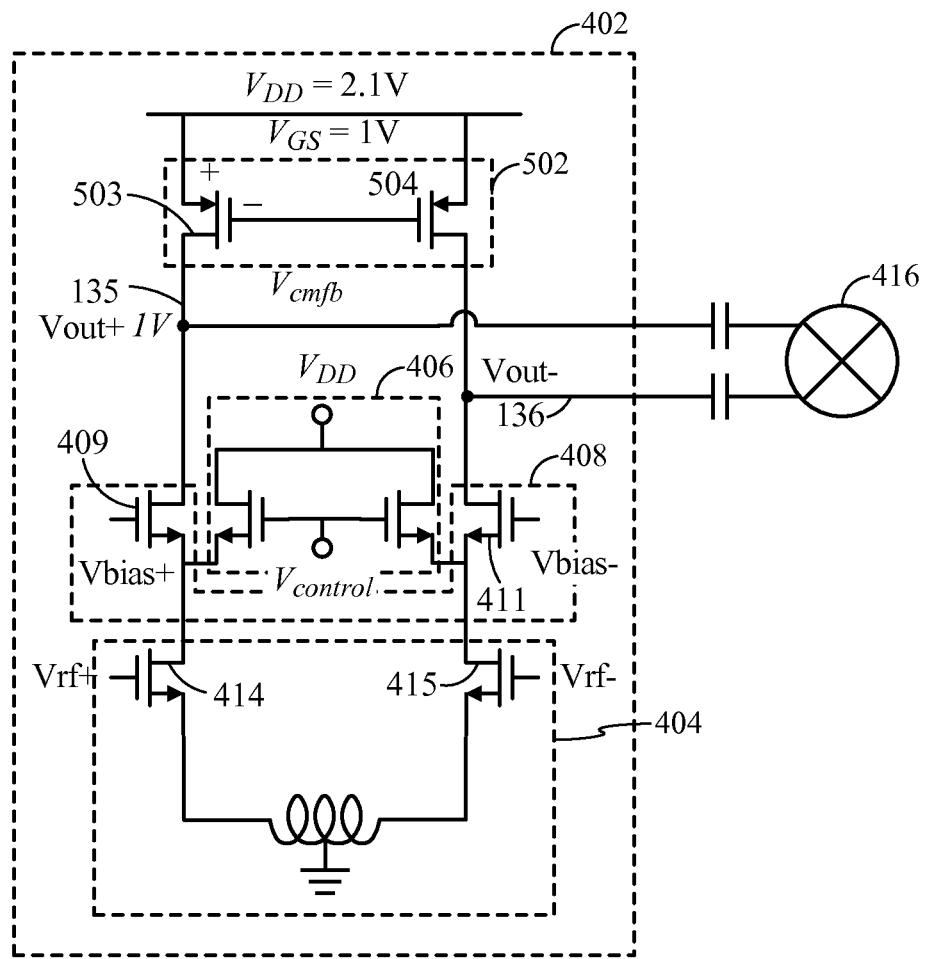
FIG. 5 is a conceptual block diagram illustrating exemplary circuitry for the LNA of FIG. 4A.

FIG. 5 is a conceptual block diagram illustrating exemplary circuitry for LNA 402 of FIG. 4A. Amplifier 404 of FIG. 4A can be implemented with circuitry included in box 404 of FIG. 5, for high gain amplification of a communication signal. At the bottom of FIG. 5 is a differential amplifier 404. The differential pair amplifier 404 has two inputs, the gate of each transistor, 414, 415, which receive signals input to circuit 402. The input transistors 414, 415 receive respectfully input signals VRF+ and VRF−. For small values of $V_{RF+}$, $i_{RF+} = g_{mn1}*V_{RF+}$. The differential pair amplifier 404 may be used as a linear amplifier for small signals. A differential pair responds to a difference mode or differential signals. Also, circuit 404 is known as a common source differential amplifier because the two input NMOS amplifiers have their sources connected together (via an inductor connected to ground in FIG. 5) and the inputs are their gates. One advantage of using a differential architecture is that ideally common mode signals will be rejected. Since the common mode signals appear at both gates, their difference is zero, and they will be rejected. Transistor circuit 408 is connected to the output of LNA 402, unlike amplifier 404 which is connected to the input of LNA 402. Transistor circuit 408 is a differential cascode stage for transistor circuit 404. Transistor circuit 408 consists of bias transistors 409, 411, connected to differential outputs Vout+, Vout− respectfully. The inputs, or gates, of transistors 409, 411 are connected to bias voltages Vbias+, Vbias−. Transistors 409 and 411 are connected in a common gate configuration and provide a low impedance for transistors 414 and 415. A cascode is often constructed from two transistors. The cascode improves input-output isolation (or reverse transmission) as there is no direct coupling from the output to input. This eliminates the Miller effect and thus contributes to a higher bandwidth. In addition, the drain of the leftmost transistor in circuit 502, 503, is connected to a first output 135 Vout+ which is operably connected to passive mixer 416. Likewise, the drain of the rightmost transistor in circuit 502, 504, is connected to a second output 136 Vout− which is operably connected to passive mixer 416. Further, current buffer 406 of FIG. 4A can be implemented with the circuitry included in box 406 of FIG. 5. When the switch 410 in FIG. 4A is closed it diverts a communication signal away from mixer 416. This diverting of the signal reduces gain and is seen to correspond with a high linearity, lower gain receiving mode (e.g., degrading NF for receiver system 400). In addition, current buffer 408 of FIG. 4B can be implemented with the circuitry included in box 408 of FIG. 5, for processing the communication signal in either a low linearity receiving mode or a high linearity receiving mode since current from amplifier 408 is summed in both scenarios as described above. That is, 408 is always on. On the other hand, current from amplifier 406 is summed only in low linearity mode when switch 412 is closed and switch 410 is open. The gain control Vcontrol determines if amplifier 406 is biased on or off." Vcontrol "on", switch 410 closed and switch 412 open, and current through from amplifier 406 is shunted to $V_{DD}$. Vcontrol "off", switch 410 open, switch 412 closed, and current from 406 is summed with current from amplifier 408.

In addition, element 502 of FIG. 5 can correspond to a load for LNA 402. Although differential circuits are illustrated in this diagram, single-ended circuits may also be used. At the top of FIG. 5 is a circuit 502 containing two PMOS transistors. The transistors are active loads. The two transistors of circuit 502 serve to bias the two NMOS devices 414, 415 in box 404. The sources of the two transistors in box 502 are connected to the supply voltage $V_{DD}$. The drain of the leftmost transistor 503 in circuit 502 is connected to the drain of transistor 409. Likewise, the drain of the rightmost transistor 504 in circuit 502 is connected to the drain of transistor 411.

Accordingly, the NF for receiver 400 can be degraded in the presence of jamming, while low noise figure can be achieved in the absence of jamming. Receiver 400 is configured to have a lower front end (but still in conformance with standards such as the IS-98 standard) gain in the presence of a jammer to achieve a higher linearity, and to switch back to higher front end gain in the absence of jamming to achieve low NF. The ability to reconfigure receiver 400 enables it to conform with the linearity and noise figure specifications of certain standards (e.g., IS-98 standard), while eliminating the use of an interstage SAW filter.

Figure 6:
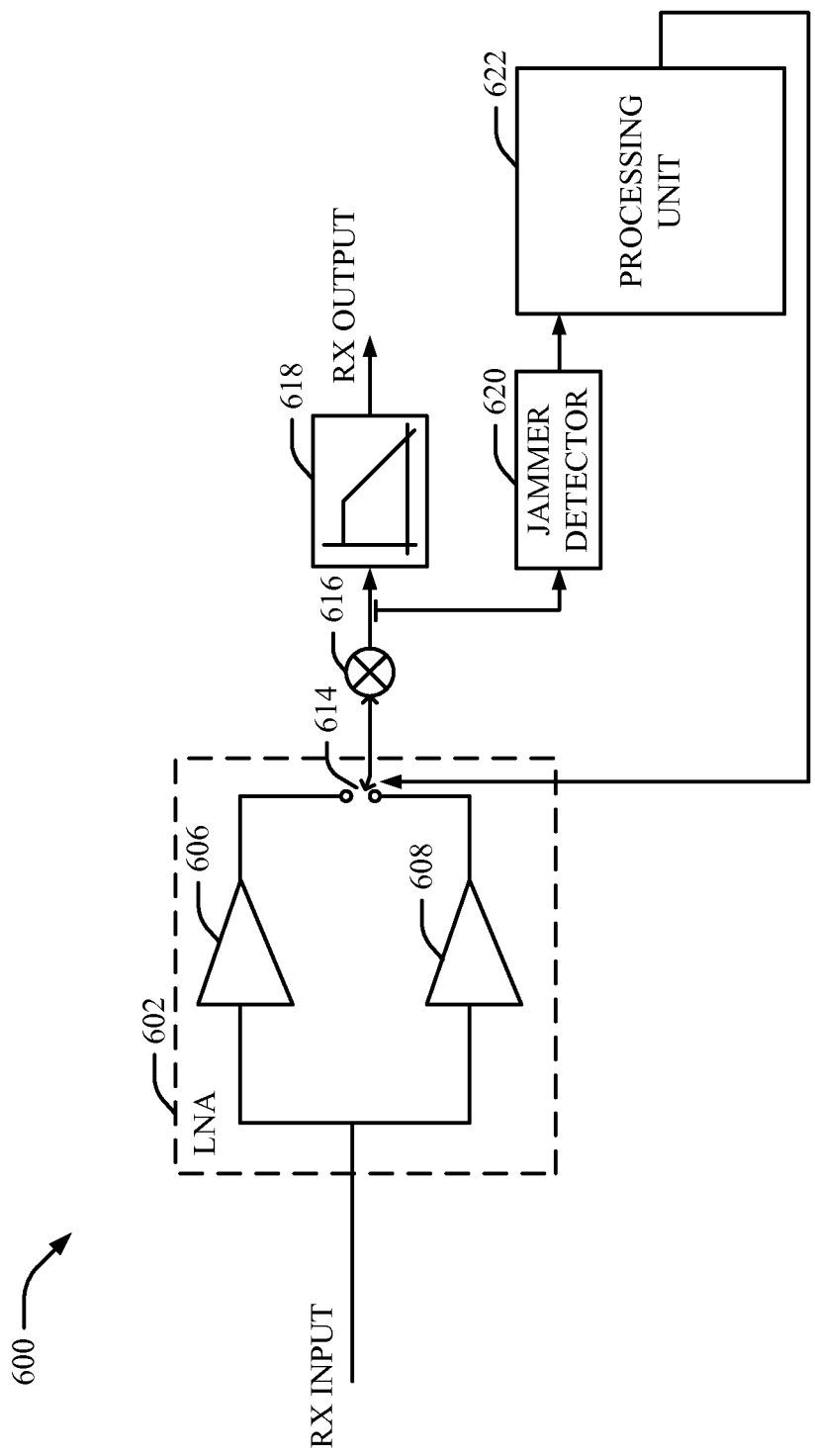
FIG. 6 is a conceptual block diagram illustrating an exemplary receiver system in which an LNA is configured to amplify a communication signal at an input portion of the LNA.

FIG. 6 is a conceptual block diagram illustrating an exemplary receiver system in which a low noise amplifier (LNA) is configured to amplify a communication signal at an input portion of the LNA. LNA 602 can amplify the communication signal in a low linearity receiving mode or a high linearity receiving mode. According to one configuration of the subject technology, receiver system 600 can correspond with receiver 206 or with access terminal 104 of FIG. 3. It should be noted that receiver system 600 is not limited to receiver 206 or access terminal 104, and can correspond with other types of electronic systems or other types of receivers.

As can be seen in FIG. 6, LNA 602 includes amplifiers 606 and 608, which are coupled to selector 614. In a high linearity, low gain receiving mode, which is based on the presence of a jamming signal, selector 614 can select the branch corresponding to amplifier 608, and current can be directed through amplifier 608 to mixer 616. This configuration can be seen to correspond with degrading the noise figure (NF) of the receiver (e.g., NF can be increased from 3 dB to 5 dB). Thus, low gain (e.g., through use of amplifier 608) and high linearity can be achieved.

Figure 7:
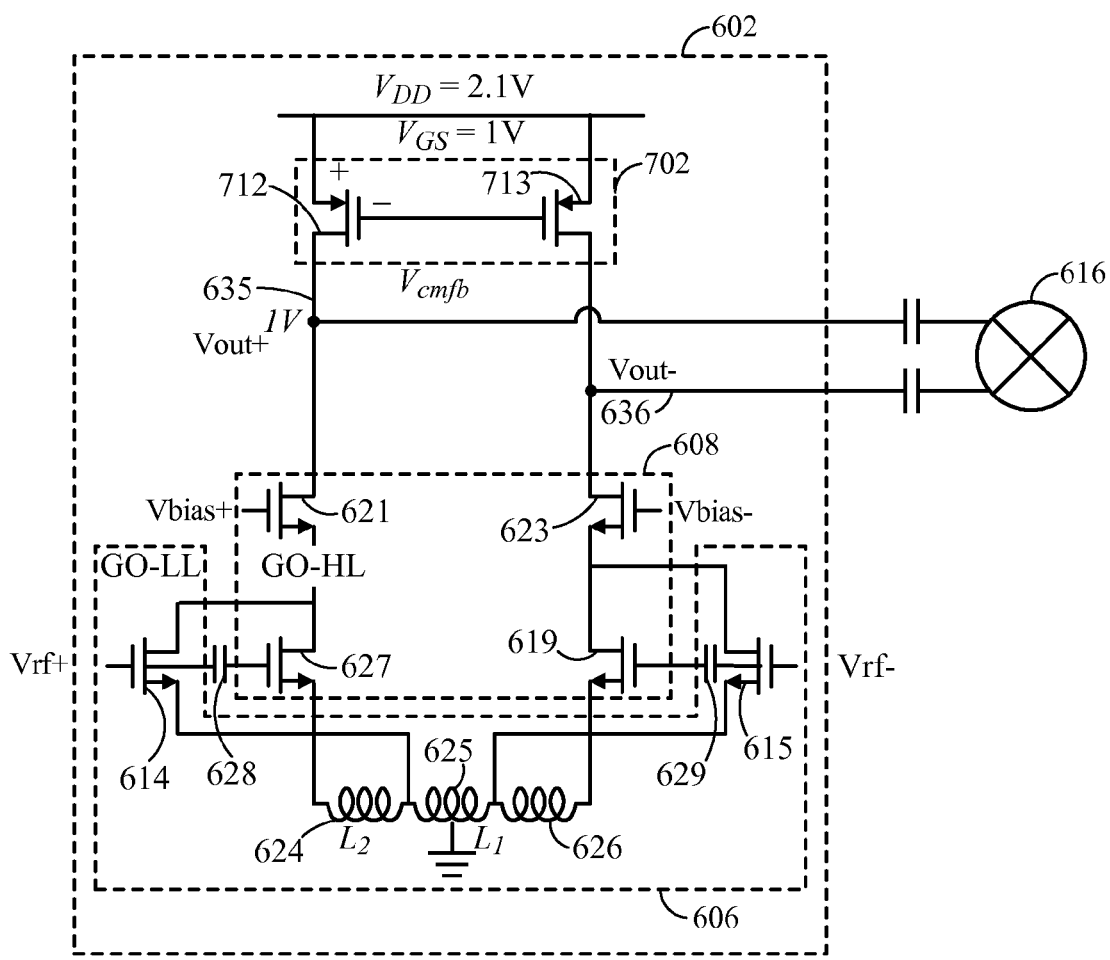
FIG. 7 is a conceptual block diagram illustrating exemplary circuitry for the LNA of FIG. 6.

In a low linearity, high gain receiving mode, which is based on the lack of a jamming signal, selector 614 can be set to the branch corresponding to amplifier 606, and current can be directed through amplifier 606 to mixer 616. Thus, high gain and low linearity can be achieved. Amplifiers 606 and 608 are never both on at the same time. When amplifier 608 is on, amplifier 606 is off. This is gain state G0, high linearity state. When amplifier 606 is on, amplifier 608 is off. This is gain state G0, low linearity state. This is illustrated in FIG. 7

Accordingly, the high linearity receiving mode can correspond with low gain and degraded NF, and the low linearity receiving mode can correspond with high gain. Receiver system 600 may have degraded linearity in the absence of jammers, as long as receiver system 600 can achieve low NF. Additionally, receiver system 600 may have degraded NF in the presence of jammers as long as receiver system 600 can achieve high linearity. In other words, low NF and high linearity do not necessarily have to be achieved simultaneously, provided that the presence/absence of jammers can be detected. Detecting the presence or absence of jamming in a signal can occur within a gain state, and the high linearity receiving mode can correspond with a lower gain for that gain state relative to that of the low linearity receiving mode.

For example, in the presence of a jammer (corresponding to a high linearity receiving mode), a signal level can be raised from −110 dBm to −90 dBm, while the receiver NF is allowed to increase from 3 dB max to 5 dB max. However, in both the low and high linearity receiving mode, a gain high enough to conform with specifications for certain standards (e.g., IS-98 standard) can still be realized. It should also be noted that controlling transitions between the low and high linearity receiving modes at an input (rather than output) portion of an LNA can take advantage of the relaxed NF, and can cause TB_IIP3 of the LNA and the DnC mixer to improve.

Mixer 616 can be configured to demodulate the communication signal, and can be coupled to baseband filter 618. Baseband filter 618 is configured to provide a baseband signal from the demodulated signal. The baseband signal can correspond to the output (e.g., Rx output) for receiver system 600.

Mixer 616 may also be coupled to jammer detector 620. Jammer detector 620 is configured to detect the presence of jamming in the communication signal.

Jammer detector 620 is coupled to processing unit 622, which can determine whether or not receiver 600 should be in a low linearity receiving mode or a high linearity receiving mode. As noted above, the presence of jamming in the communication signal can be used as a basis for which linearity receiving mode (high or low) LNA 402 will use. In particular, LNA 602 can be in a low gain, high linearity receiving mode when jamming is detected, and in a high gain, low linearity receiving mode when jamming is not detected. Processing unit 622 can make the determination and can control transitions between modes based on the output of jammer detector 620.

According to one configuration of the subject technology, processing unit 622 can be a digital signal processor (DSP). In addition, processing unit 622 can correspond with at least part of processing system 202, or can correspond with another type of processor.

FIG. 7 is a conceptual block diagram illustrating exemplary circuitry for LNA 602 of FIG. 6. In FIG. 7, features of the LNA are adjusted to adjust linearity. For example, transistor circuit 606 of FIG. 6 can be implemented with the circuitry included in box 606 of FIG. 7. The circuitry in box 606 can correspond with a high linearity, low gain receiving mode (e.g., degrading NF for receiver system 600). Amplifier 606 is a differential amplifier with two inputs, the gate of each transistor, 614, 615, which receive signals Vrf+ and Vrf− respectfully. The input transistors 614, 615 receive respectfully input signals Vrf+ and Vrf−. Also, circuit 606 is known as a common source differential amplifier because the two input NMOS amplifiers have their sources connected together (via an inductor L1 connected to ground in FIG. 5) and the inputs are their gates. The two different inductor values, $L_1$ and $L_2$, represent two different loads for transistor circuits 606 and 608. Transistors 614, 627, 615 and 619 are transconductance (gm) stages. Gm device inputs voltage and outputs current. (The input to a LNA is a voltage, while the output is a current). In addition, amplifier 608 of FIG. 6 can be implemented with the circuitry included in box 608 of FIG. 7. The circuitry in box 606 can correspond with a low linearity, high gain receiving mode. Amplifier 608 is also a differential amplifier wherein each leg has a cascoded configuration. The gates of the lower two amplifiers 627, 619 are the signal inputs and the gates of the upper two amplifiers 621, 623 are the bias inputs. Transistors 621, 623 serve as "cascode" devices and provide a low impedance for transistors 614, 627, and 619, 615. The source of cascode transistor 621 is tied to the drains of transistors 614 and 618. Likewise, the source of cascode transistor 623 is tied to the drains of transistors 615 and 619. Capacitors 628 and 629 are coupling capacitors. In addition, element 702 of FIG. 7 can correspond to a load for LNA 602. The two PMOS transistors 712, 713 serve as active loads and bias the drains of the cascode transistors 621 and 623 respectively. As noted above, although gain state G0 is illustrated and described by FIG. 7, any other gain state (e.g., G1, G2 or G3) may be used. Although differential circuits are illustrated in this diagram, single-ended circuits may also be used. Thus, amplifier 606 is marked G0-LL which means it is conducting current during gain state 0, low linearity and high gain. In G0-LL mode, transistors 614, 615 are on and 627, 619 are off. Transistors 614, 615 see a degenerative inductance of ½ L1 (see path from source of either 614 or 615 to 625 to ground). The lower degenerative inductance results in low linearity, high gain and good NF. Amplifier 608 is marked G0-HL which means it is conducting current during gain state 0, high linearity and low gain. In G0-HL mode, good linearity is achieved at the expense or tradeoff of poor Noise Figure. Transistors 627 and 619 are on and transistors 614 and 615 are off. In G0-HL mode, we turn off transistor circuits 614, 615 because they are low linearity amps. So transistor circuit 608 is on and transistor circuit 606 is off. Transistors 627 and 619 see a high degenerative inductance, L2 plus ½ L1, 624 and ½ 625. The higher degenerative inductance results in high linearity, low gain and poor NF. One varies the degenerative inductance to vary the gain which varies the linearity.

Accordingly, the NF for receiver 600 can be degraded (high noise figure) in the presence of jamming, while low noise figure can be achieved in the absence of jamming. Receiver 600 is configured to have a lower front end (but still in conformance with standards such as the IS-98 standard) gain in the presence of a jammer to achieve a higher linearity, and to switch back to higher front end gain in the absence of jamming to achieve low NF. The ability to reconfigure receiver 600 enables it to conform with the linearity and noise figure specifications of certain standards (e.g., IS-98 standard) while eliminating the use of an interstage SAW filter.

Figure 8:
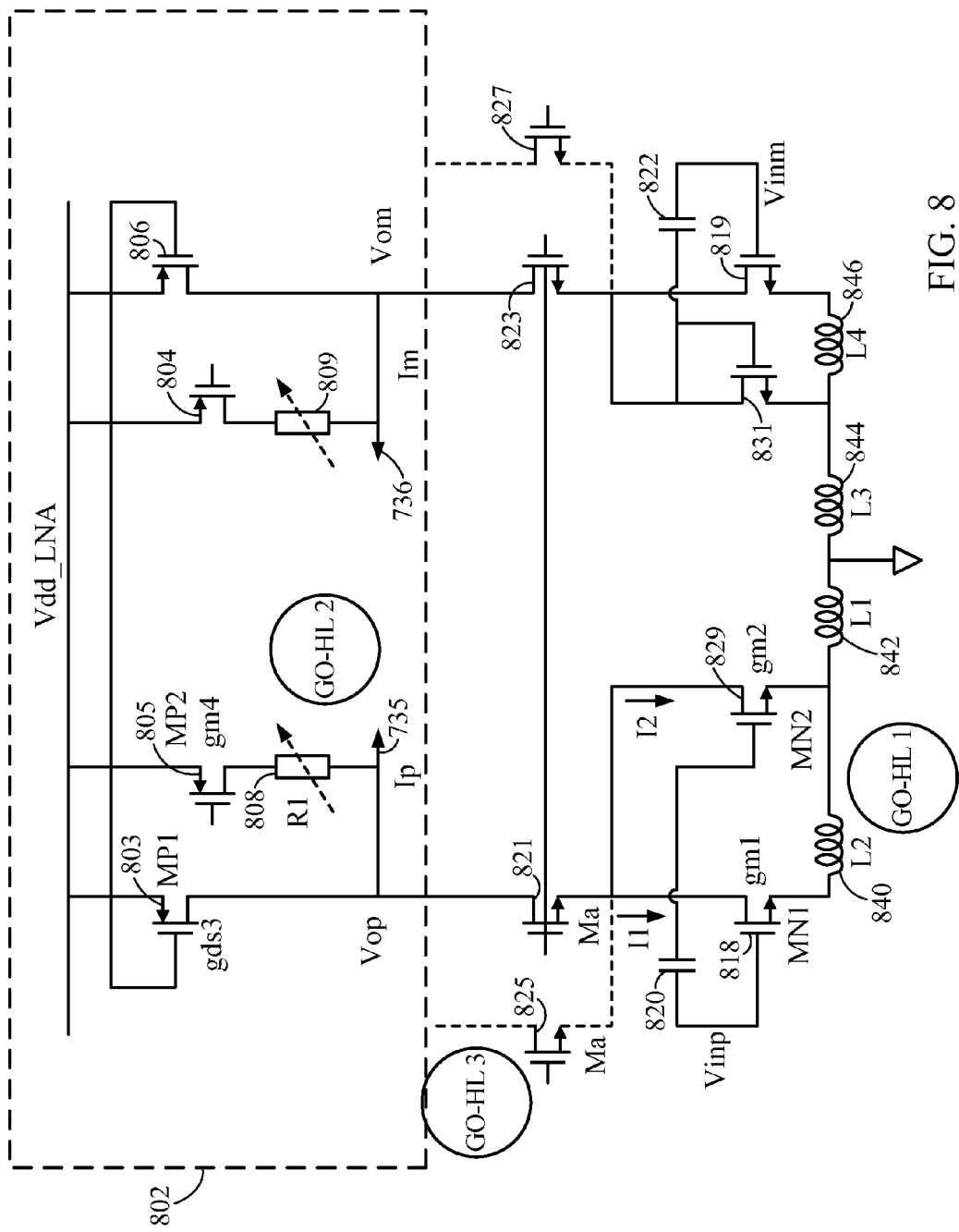
FIG. 8 is a conceptual block diagram illustrating an exemplary receiver system with different LNA configurations for amplifying a communication signal.

FIG. 8 is a conceptual block diagram illustrating an exemplary receiver system with different LNA configurations for amplifying a communication signal. FIG. 8 depicts three configurations for transitioning between a low linearity receiving mode and a high linearity receiving mode by controlling signal strength applied to the mixer. These three configurations are depicted as G0-HL 1 to 3 in FIG. 8. It should be noted that the circuitry shown in FIG. 8 is in a differential mode, and the G0-HL operations described with respect to the left side of the circuitry applies to the right side of the circuitry. Although differential circuits are illustrated in this diagram, single-ended circuits may also be used. Additionally, as noted above, although G0 is illustrated and described by FIG. 8, any other gain state (e.g., G1, G2 or G3) may be used.

In this regard, the configuration for G0-HL 1 corresponds with transitioning between modes at an input portion of an LNA. In a high linearity receiving mode, NMOS transistors 818_MN1 and 829 MN2 are on for cross modulation (XMOD) product cancellation. In G0-HL 1, current applied to mixer 416 is siphoned off by NMOS transistors 818 MN1 and 829 MN2, thereby increasing linearity. In a low linearity receiving mode, transistor 818 MN1 is off and transistor 829 MN2 is on and L1~0.45(L1+L2). More current flows to the mixer, reducing linearity. In addition, G0-HL 1 in FIG. 8 can be implemented in any frequency band (e.g., 450 MHz frequency band).

The configuration for G0-HL 2 corresponds with transitioning between modes at an output portion of an LNA. In G0-HL 2, current applied to mixer is siphoned off, thereby increasing linearity. In this configuration, when PMOS transistor 805 MP2 is on, the LNA can transition from a low linearity receiving mode to a high linearity receiving mode, by adjusting the resistor 808 R1 for current bleeding and providing some gain deboost at the same time. R1 provides fine tuning. R1 adjusts the current that is bled from transistor 805. The higher the value of R1, the greater the current that flows into the mixer and the lower the linearity of the mixer. The lower the value of R1, the lower the current that flows into the mixer and the higher the linearity of the mixer. By controlling the flow of current to the mixer, one is controlling the linearity of the circuit. By reducing current to the mixer, you are deboosting gain. Transistor 803 MP1, together with the corresponding transistor 806 on the right side of FIG. 8, can be seen to correspond with the transistors in box 502 of FIG. 5. At the top of FIG. 8 is a circuit 802 containing PMOS transistors, 803 and 806. The transistors may also be described as active loads. The transistors 803, 806 of circuit 802 serve to bias the two NMOS devices 818, 819 in the saturation region. The sources of the transistors 803-806 in box 802 are connected to the supply voltage VDD. The drain of the leftmost transistors 803, 805 in circuit 802 is connected to the drain of transistor 821. Likewise, the drain of the rightmost transistors 804, 806 in circuit 802 is connected to the drain of transistor 823. In addition, the drain of the leftmost transistors 804, 806 in circuit 802 is connected to a first output Vout positive, Vop, 735 which is operably connected to passive mixer 416. Likewise, the drain of the rightmost transistors 804, 806 in circuit 802 are connected to a second output Vout minus, Vom, 736 which is operably connected to passive mixer 416. G0-HL 2 in FIG. 8 can be implemented in any frequency band (e.g., 450 MHz frequency band).

Figures 9A, 9B:
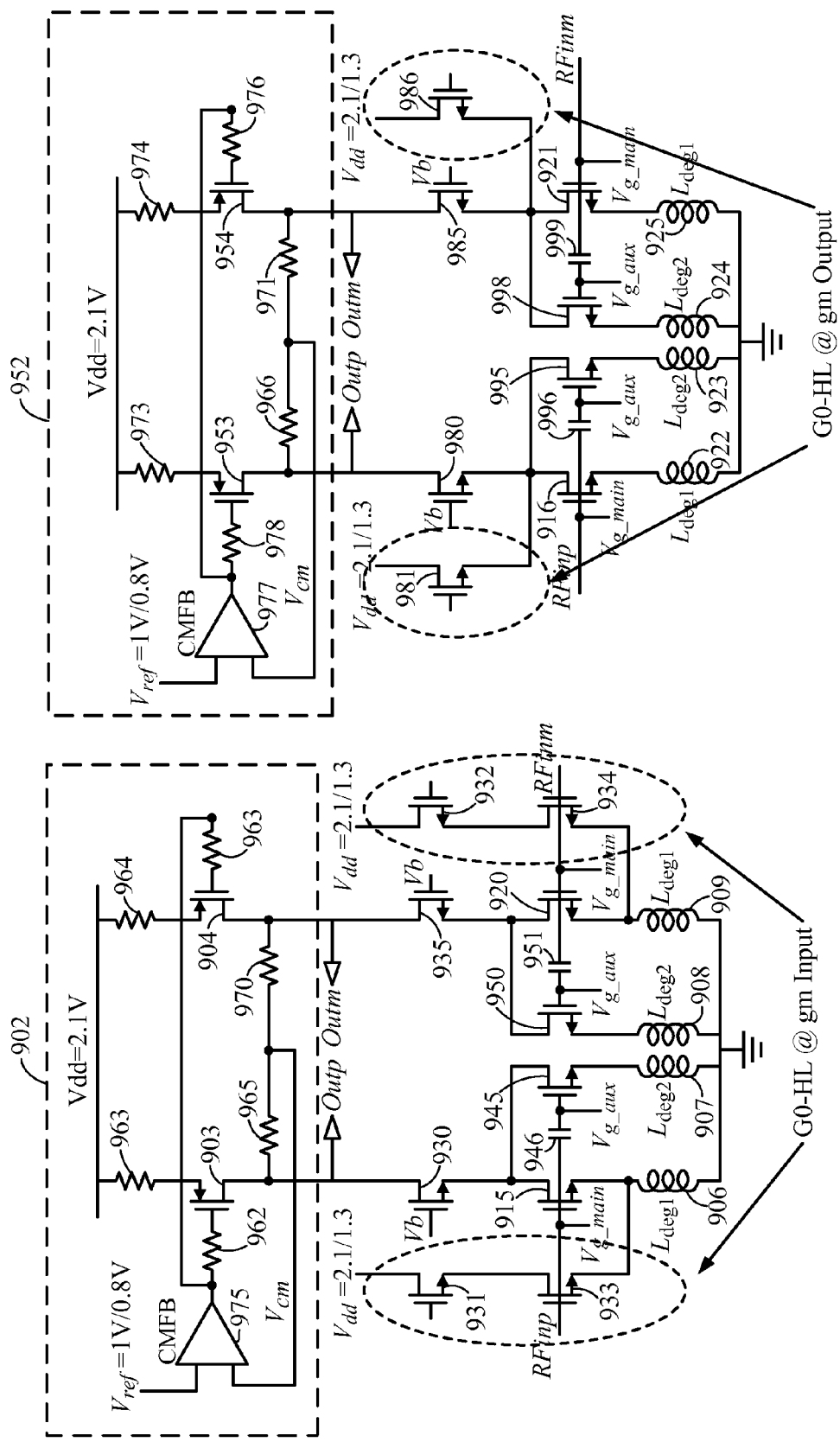
FIGS. 9A and 9B are conceptual block diagrams illustrating exemplary receiver systems with further LNA configurations for amplifying a communication signal.

The configuration for G0-HL 3 corresponds with transitioning between modes at an output portion of an LNA. In this configuration, the LNA can transition from a low linearity receiving mode to a high linearity receiving mode by using a split cascode transistor and by bleeding AC current to Vdd. Bleeding current to Vdd reduces current to the mixer 416, and thereby, improves linearity. G0-HL 3 in FIG. 8 can be seen to correspond with the transistors in box 406 of FIG. 5. FIGS. 9A and 9B are conceptual block diagrams illustrating exemplary receiver systems with further LNA configurations for amplifying a communication signal. At the top of FIG. 9A is a circuit 902 containing two PMOS transistors, 903, 904. The transistors are "diode connected" transistors and may also be described as active loads. The two transistors 903, 903 of circuit 902 serve to bias the two NMOS devices 915, 920 in the saturation region. The sources of the two transistors in box 902 are connected to the supply voltage Vdd. The drain of the leftmost transistor 903 in circuit 902 is connected to the drain of transistor 930. Likewise, the drain of the rightmost transistor 904 in circuit 902 is connected to the drain of transistor 935. Transistors 930 and 935 act as cascode transistors for transistors 915 and 920 respectively. Transistors 915 and 920 are arranged in a common source configuration with their source connected to ground through inductors 906 and 909 respectively. A bias voltage Vb is connected to the gates of cascode transistors 930 and 935. In addition, the drain of the leftmost transistor in circuit 902 is connected to a first output, output positive ("Outp"), which is operably connected to passive mixer 416. Likewise, the drain of the rightmost transistor 904 in circuit 902 is connected to a second output, output minus ("Outm") which is operably connected to passive mixer 416. The operational amplifier 975 along with resistors 965 and 970 form a common mode feedback loop to bias the PMOS devices 903, 904. This improves the output impedance of the PMOS devices 903, 904. Transistors 945 and 950 are auxiliary transistors. The nonlinearity in the main current $I_{MAIN}$ is sensed by a cascode NMOS transistor 930. More specifically, cascode NMOS transistors 930 and 935 sense the non-linearity in $I_{MAIN}$ due to main transistors 915 and 920. This nonlinearity is input to the feed forward (or auxiliary) transistors 945 and 950. These auxiliary transistors 945, 950 generate a current $I_{AUX}$ in response to the nonlinear input. The effective current $I_{SUM}$ is the summation of $I_{AUX}$ and $I_{MAIN}$. The current $I_{AUX}$ cancels the nonlinear component in $I_{MAIN}$ and thereby improves the intermodulation performance of the overall circuit. The auxiliary transistor pair auxiliary devices 945 and 950 are biased in the weak inversion region to provide the optimum cancellation of the non-linearity in $I_{MAIN}$. The voltage at the source of transistor 930 responds to the nonlinear current from transistor 915. This change in the voltage due to the nonlinear current is sensed by the auxiliary transistor 945, and feed forwards an error current to be summed at the output node. The main differential pair devices 915 and 920 and the auxiliary devices 945 and 950 are biased in the appropriate region for optimum intermodulation performance.

With reference to FIG. 9A, deboost at gm input can provide a higher linearity main path, and it can be easier for cross modulation products XMOD to get cancelled from the auxiliary path. However, it may be noted that deboost at gm input may require more DC consumption. Transistor 930, 935 provides the injector current. When the transistors 920, 933 are biased on, a high linearity state is achieved, G0HL. The added current causes the degeneration inductor 906 look larger. Adjusting the degenerative inductors may produce cancellation of undesired current, e.g., interference, from transistors 915, 945 and 920, 950. Thus produces a cleaner signal and, therefore, better linearity. When the transistors 920, 933 are biased off, a low linearity state is achieved, G0LL. Regarding FIG. 9B, NF can be better for implementing deboost at gm output, due to the stronger initial LNA transconductance gm. Transistors 980, 985 provide the injector current. The added current causes the degeneration inductor 922 look larger. Adjusting the degenerative inductors may produce cancellation of undesired current, e.g., interference, from transistors 916, 995 and 921, 998. This produces a cleaner signal and, therefore, better linearity. G0-HL of FIG. 9A can be seen to correspond with a variation of G0-HL of FIG. 7, and G0-HL of FIG. 9B can be seen to correspond with the transistors in box 406 of FIG. 5. As noted above, although G0 is illustrated and described by FIGS. 9A and 9B, any other gain state (e.g., G1, G2 or G3) may be used. Although differential circuits are illustrated in these diagrams, single-ended circuits may also be used.

Figure 10:
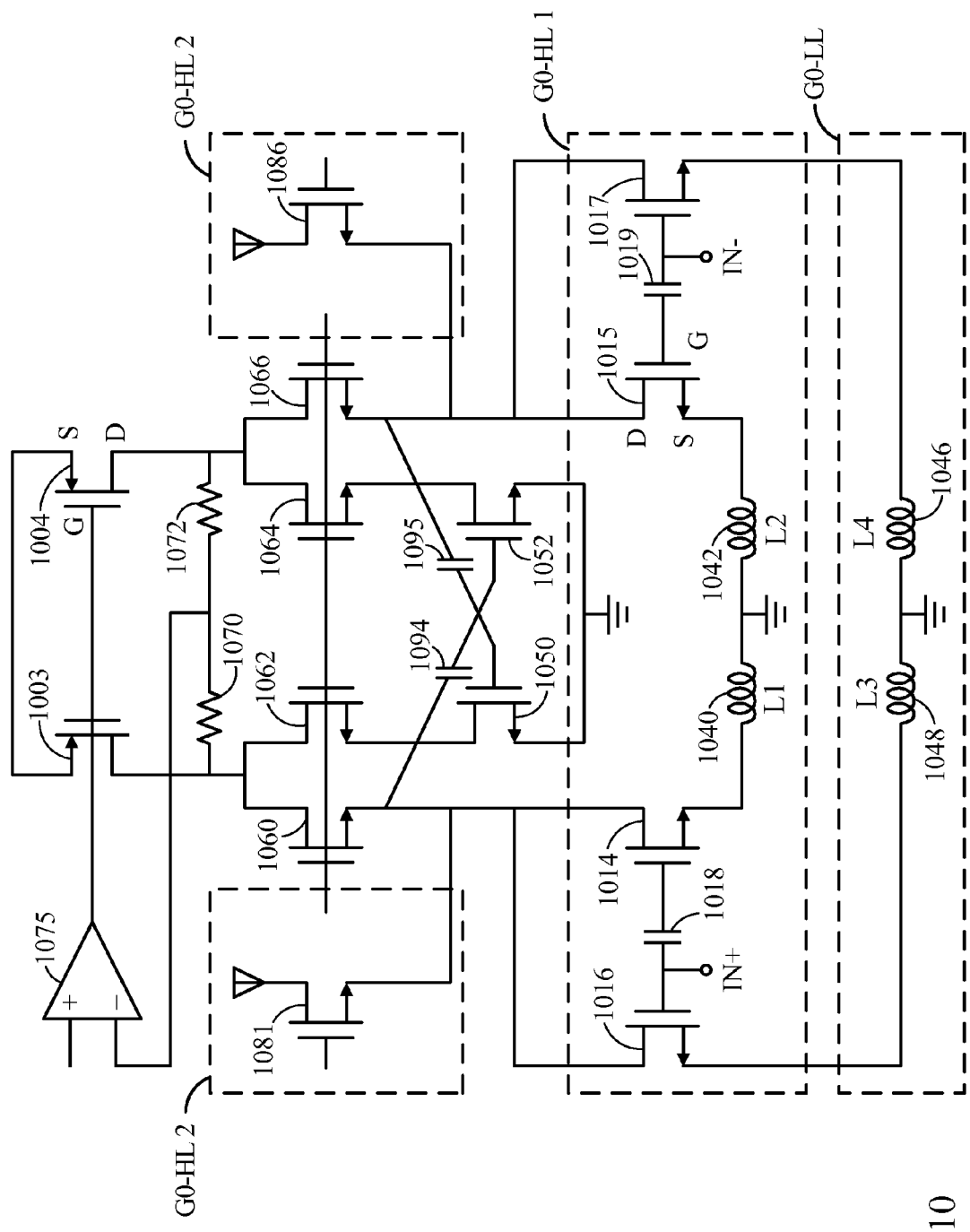
FIG. 10 is a conceptual block diagram illustrating an exemplary receiver system with different LNA configurations for amplifying a communication signal.

FIG. 10 is a conceptual block diagram illustrating an exemplary receiver system with different LNA configurations for amplifying a communication signal.

FIG. 6 is a circuit diagram that shows LNA 110 in further detail. LNA 110 includes two differential input signal terminals 200 and 201, a DC biasing circuit M 202, a DC biasing circuit C 203, an M1_main field effect transistor (FET) 204, an M2_main FET 205, an M1_cancel FET 206, an M2_cancel FET 207, a first cascode circuit 208 including two FETs 209 and 210, a second cascode circuit 211 including two FETs 212 and 213, two capacitors 214 and 215, a first degeneration inductor L1 216, a second degeneration inductor L2 217, an LNA load 218 including two inductors 219 and 220 and a capacitor 221, and two differential output signal nodes 222 and 223. All transistors 204-207, 209, 210, 212 and 213 are N-channel FETs. Inductors 216, 217, 219 and 220 and capacitors 214, 215 and 221 are integrated components formed on RF transceiver integrated circuit 103 using semiconductor fabrication processes.

Biasing circuit M 202 supplies a DC bias voltage VBIAS1 onto the gates of cascode FETs 209 and 213. Biasing circuit M 202 also supplies a DC bias voltage VBIAS3 onto the gate of main FET 204 and supplies a DC bias voltage VBIAS4 onto the gate of main FET 205 as illustrated. These bias voltages are set such that the main FETs 204 and 205 are biased in their saturation operating regions. Biasing circuit C 203 supplies a DC bias voltage VBIAS2 onto the gates of cascode FETs 210 and 212. Biasing circuit C 203 also supplies a DC bias voltage VBIAS5 onto the gate of cancel FET 206 and supplies a DC bias voltage VBIAS6 onto the gate of cancel FET 207. These bias voltages are set such that the cancel FETs 206 and 207 are biased in their sub-threshold operating regions. The sub-threshold operating region is sometimes referred to as the weak inversion operating region. Although in the example of FIG. 6 there are two bias voltages used to bias cascode transistors 209, 213, 210 and 212, in other embodiments the gates of all the cascode transistors are connected together and a single DC bias voltage is used to bias all the cascode transistors.

FIG. 10 depicts two configurations for transitioning an LNA between a high linearity receiving mode and a low linearity receiving mode. These two configurations are depicted as G0-HL 1 and 2 in FIG. 10. Also, although G0 is illustrated and described by FIG. 10, any other gain state (e.g., G1, G2 or G3) may be used. Although differential circuits are illustrated in this diagram, single-ended circuits may also be used.

FIG. 10 shows a linearized LNA whose gain, noise figure and linearity can be adjusted dynamically depending on the system requirements (per example, gain mode) to optimize the performance of the overall receiver. This LNA has two. A main path whose primary function is to amplify the input signal (and also mainly defines the LNA Noise Figure) and a cancellation (or linearization) path, that cancels the IM3 currents of the main path to enhance the overall LNA linearity. The main cancellation path is constituted by devices 1050, 1052 1062 and 1064. The rest of the devices belong to the main path or a common to both.

The main path has two differential input pairs connected in parallel that use different degeneration inductors. Conceptually, only one of these input pairs is active at a time, although it is possible to configure this LNA to allow a concurrent operation. The differential pair constituted by 1016 and 1017 uses a smaller degeneration inductor (L3 and L4), resulting in a larger LNA gain and lower Noise Figure at expense of a lower LNA linearity. This differential pair is therefore used in low linearity mode (G0-LL). The differential pair constituted by 1014 and 1015 use a larger degeneration inductor (L1 and L2) and provides a smaller LNA gain and improved linearity at expense of increased Noise Figure; it is used in G0-HL. Both differential pairs (1014-1015 and 1016-1017) are biased in the saturation region although their bias currents can be different.

The role of devices 1050 and 1052 is to improve the overall LNA linearity by providing an IM3 current that cancels the IM3 current produced by the input differentials pairs (1014-1015 or 1016-1017). To achieve this goal, devices 1050 and 1052 are biased in the sub-threshold region while the input differential pairs are biased in the saturation region. The signal and IM3 currents from the main and cancellations paths are added together at the drain of the output cascode devices (1060,1064,1062 and 1066); signal currents add constructively while IM3 currents cancel resulting in an overall improved LNA linearity. By properly choosing the bias current and size of 1050 and 1052 it is possible align the magnitude and phase of the IM3 currents to optimize the LNA linearity.

Devices 1081 and 1086 constitute a bleeding stage. When turned OFF, these devices have very little impact on the LNA performance. However, when turned ON, they could be used to decrease the amount of current provided by the LNA to the mixer in case the mixer linearity limited the overall RX chain linearity. The size ratio between 1060 and 1081 (or 1066 and 1086) controls the amount of current provided by the input differential pairs that is finally delivered to the mixer.

The configuration for G0-HL 1 corresponds with transitioning between modes at an input portion of an LNA. In this configuration, the LNA can transition from a low linearity receiving mode to a high linearity receiving mode. In doing so, the degeneration inductor can be increased. This is seen to achieve better linearity at the expense of increased NF. For example, the gain deboost can be implemented at 5 dB. Additionally, for an inductor load, NF can go from 1.87 dB to 2.86 dB. For a p-channel MOSFET (PMOS) load, NF can go from 2.52 dB to 4.18 dB. G0-HL 1 of FIG. 10 can be seen to correspond with a variation of G0-HL of FIG. 7.

As can be seen in FIG. 10, L1 and L2 and the corresponding transistors may be used in a high linearity receiving mode. Further, L3 and L4 and the corresponding transistors may be used in a low linearity receiving mode.

The configuration for G0-HL 2 corresponds with transitioning between modes at an output portion of an LNA. In this configuration, the LNA can transition from a low linearity receiving mode to a high linearity receiving mode, using a split cascode transistor and by bleeding AC current to VDD. The overall observed NF degradation can be similar to that of the configuration for G0-HL 1 of FIG. 10. G0-HL 2 of FIG. 10 can be seen to correspond with the transistors in box 406 of FIG. 5.

Figure 11:
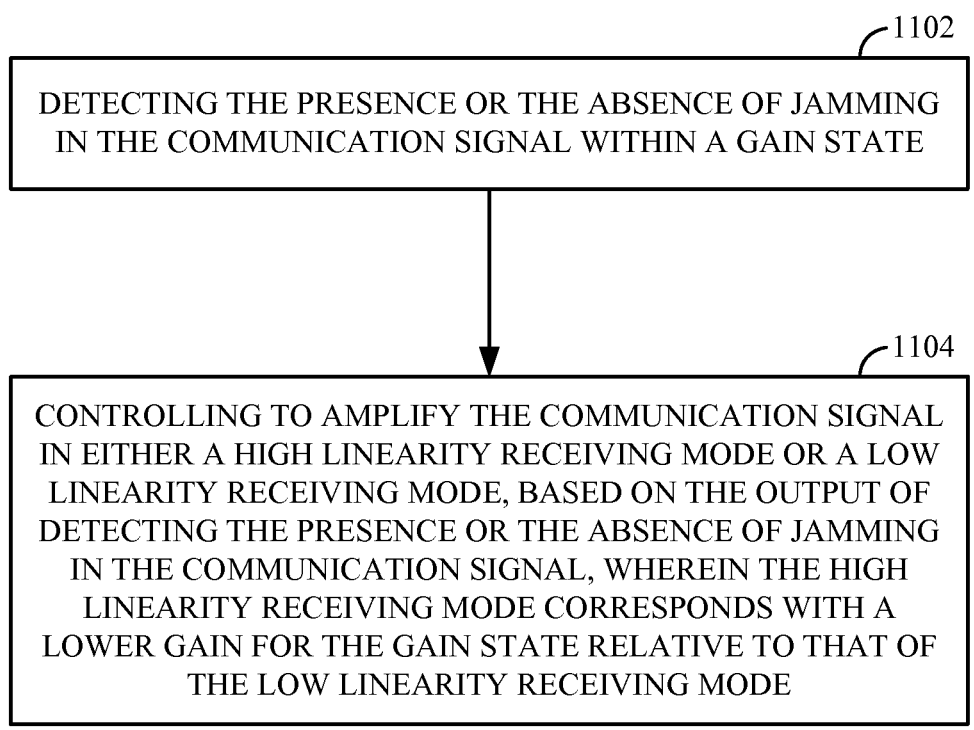
FIG. 11 is a flowchart illustrating an exemplary operation of processing a communication signal in a receiver.

FIG. 11 is a flowchart illustrating an exemplary operation of processing a communication signal in a receiver. In step 1102, the presence or the absence of jamming in the communication signal is detected. In step 1104, the amplifying of the communication signal in either a high linearity receiving mode or a low linearity receiving mode is controlled, based on the output of detecting the presence or the absence of jamming in the communication signal. The high linearity receiving mode corresponds with a lower gain for the gain state relative to that of the low linearity receiving mode.

Figure 12:
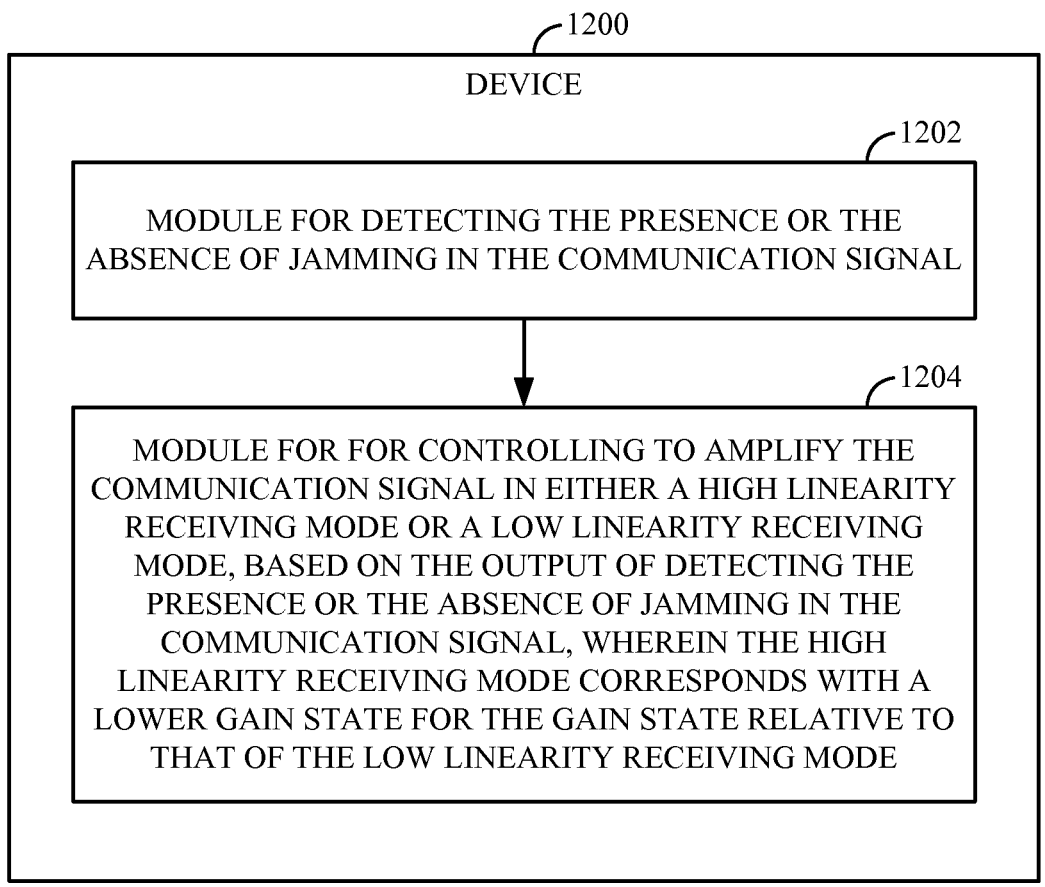
FIG. 12 is a conceptual block diagram illustrating an example of the functionality of a device for processing a communication signal in a receiver.

FIG. 12 is a conceptual block diagram illustrating an example of the functionality of a device for processing a communication signal in a receiver. Device 1200 includes a module 1202 for detecting the presence or the absence of jamming in the communication signal. Device 1200 also includes a module for controlling to amplify the communication signal in either a high linearity receiving mode or a low linearity receiving mode, based on the output of detecting the presence or the absence of jamming in the communication signal. The high linearity receiving mode corresponds with a lower gain for the gain state relative to that of the low linearity receiving mode.

Referring back to FIG. 2, processing system 202 may be implemented using software, hardware, or a combination of both. By way of example, processing system 202 may be implemented with one or more processors. A processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or any other suitable device that can perform calculations or other manipulations of information. Processing system 202 may also include one or more machine-readable media for storing software. Software shall be construed broadly to mean instructions, data, or any combination thereof, whether referred to as software, firmware, middleware, microcode, hardware description language, or otherwise. Instructions may include code (e.g., in source code format, binary code format, executable code format, or any other suitable format of code).

Machine-readable media may include storage integrated into a processor, such as might be the case with an ASIC. Machine-readable media may also include storage external to a processor, such as a random access memory (RAM), a flash memory, a read only memory (ROM), a programmable read-only memory (PROM), an erasable PROM (EPROM), registers, a hard disk, a removable disk, a CD-ROM, a DVD, or any other suitable storage device. In addition, machine-readable media may include a transmission line or a carrier wave that encodes a data signal. Those skilled in the art will recognize how best to implement the described functionality for processing system 202. According to one aspect of the disclosure, a machine-readable medium is a computer-readable medium encoded or stored with instructions and is a computing element, which defines structural and functional interrelationships between the instructions and the rest of the system, which permit the instructions' functionality to be realized. Instructions may be executable, for example, by an access terminal or a processing system. Instructions can be, for example, a computer program including code. A machine-readable medium may comprise one or more media.

Those of skill in the art would appreciate that the various illustrative blocks, modules, elements, components, methods, and algorithms described herein may be implemented as electronic hardware, computer software, or combinations of both. Skilled artisans may implement the described functionality in varying ways for each particular application. Furthermore, various components and blocks may be arranged differently (e.g., arranged in a different order, or partitioned in a different way) all without departing from the scope of the subject technology.

In one aspect of the subject technology, an LNA may refer to an amplifier. While the subject technology is illustrated using n-channel MOSFET (NMOS) and p-channel MOSFET (PMOS) transistors (i.e., CMOS), the subject technology may be practiced utilizing other types of transistors (e.g., bipolar transistors or a combination of bipolar and CMOS transistors). A gate, a source, and a drain of a MOSFET may correspond to a base, an emitter, and a collector of a bipolar transistor. A gate, a source, and a drain of a MOSFET are illustrated in FIG. 10 with label G, S, and D, respectively.

It is understood that the specific order or hierarchy of steps in the processes disclosed is an illustration of exemplary approaches. Based upon design preferences, it is understood that the specific order or hierarchy of steps in the processes may be rearranged. The accompanying method claims present elements of the various steps in a sample order, and are not meant to be limited to the specific order or hierarchy presented.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description is provided to enable any person skilled in the art to practice the various configurations described herein. Various modifications to these configurations will be readily apparent to those skilled in the art, and the generic principles defined herein may be applied to other configurations. Thus, the claims are not intended to be limited to the configurations shown herein, but is to be accorded the full scope consistent with the claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The terms used herein such as "for example," "for instance," "example," "instance," "by way of example," "such as," and the like indicate an illustration by way of example, and not by way of limitation. All structural and functional equivalents to the elements of the various configurations described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A receiver, comprising:
   a jammer detector configured to detect the presence or the absence of jamming in a communication signal within a gain state;
   an amplifier configured to amplify the communication signal in a high linearity receiving mode or a low linearity receiving mode, wherein the high linearity receiving mode corresponds with a lower gain for the gain state in the amplifier relative to that of the low linearity receiving mode; and
   a processing unit coupled to the jammer detector, the processing unit being configured to control the amplifier to amplify the communication signal in either the high linearity receiving mode or the low linearity receiving

17 mode, based on the output of the jammer detector detecting the presence or the absence of jamming in the communication signal, wherein the processing unit is configured to control the amplifier to amplify the communication signal in the high linearity receiving mode if the jammer detector detects the presence of jamming in the communication signal.

2. The receiver of claim 1, wherein the processing unit is configured to control the amplifier to amplify the communication signal in the low linearity receiving mode if the jammer detector does not detect the presence of jamming in the communication signal.

3. The receiver of claim 1, wherein the receiver has a relatively poorer noise figure if the amplifier is amplifying the communication signal in the high linearity receiving mode in the gain state, and wherein the receiver has a relatively better noise figure if the amplifier is amplifying the communication signal in the low linearity receiving mode in the gain state.

4. The receiver of claim 1, wherein the lower gain of the amplifier in the high linearity receiving mode is associated with a degraded noise figure (NF) of the receiver.

5. The receiver of claim 1, wherein the processing unit is a digital signal processor (DSP).

6. The receiver of claim 1, wherein the processing unit is configured to control the amplifier to amplify the communication signal in either the high linearity receiving mode or the low linearity receiving mode at an input portion of the amplifier.

7. The receiver of claim 6, wherein the amplifier comprises two amplifiers, and wherein the two amplifiers correspond with amplifying the communication signal in either the high linearity receiving mode or the low linearity receiving mode.

8. The receiver of claim 1, wherein the processing unit is configured to control the amplifier to amplify the communication signal in either the high linearity receiving mode or the low linearity receiving mode at an output portion of the amplifier.

9. The receiver of claim 1, wherein the amplifier comprises a high gain amplifier, two current buffers coupled to the high gain amplifier, two switches coupled to one of the current buffers, and a combiner, wherein the two switches and the two current buffers correspond with amplifying the communication signal in either the high linearity receiving mode or the low linearity receiving mode.

10. The receiver of claim 1, further comprising a mixer configured to downconvert a signal output from the amplifier.

11. The receiver of claim 10, further comprising a baseband filter configured to filter the downconverted signal.

12. A method for processing a communication signal in a receiver, comprising:
    detecting the presence or the absence of jamming in the communication signal within a gain state; and
    amplifying the communication signal in either a high linearity receiving mode or a low linearity receiving mode, based on the presence or the absence of jamming in the communication signal, wherein the high linearity receiving mode corresponds with a lower gain for the gain state relative to that of the low linearity receiving mode, wherein the amplifying of the communication signal in the high linearity receiving mode is performed if the presence of jamming is detected in the communication signal.

13. The method of claim 12, wherein the amplifying the communication signal in the low linearity receiving mode is performed if the presence of jamming is not detected in the communication signal.

14. The method of claim 12, wherein the receiver has a relatively poorer noise figure if the communication signal is being amplified in the high linearity receiving mode in the gain state, and wherein the receiver has a relatively better noise figure if the communication signal is being amplified in the low linearity receiving mode in the gain state.

15. The method of claim 12, wherein the lower gain in the high linearity receiving mode is associated with a degraded noise figure (NF) of the receiver.

16. The method of claim 12, wherein the amplifying is performed by a digital signal processor (DSP).

17. The method of claim 12, further comprising:
    downconverting the amplified signal; and
    filtering the downconverted signal.

18. An apparatus for processing a communication signal in a receiver, comprising:
    means for detecting the presence or the absence of jamming in the communication signal within a gain state; and
    means for amplifying the communication signal in either a high linearity receiving mode or a low linearity receiving mode, based on the output of detecting the presence or the absence of jamming in the communication signal, wherein the high linearity receiving mode corresponds with a lower gain for the gain state relative to that of the low linearity receiving mode, wherein the means for amplifying amplifies the communication signal in the high linearity receiving mode if the presence of jamming is detected in the communication signal.

19. The apparatus of claim 18, wherein the means for amplifying amplifies the communication signal in the low linearity receiving mode if the presence of jamming is not detected in the communication signal.

20. The apparatus of claim 18, wherein the receiver has a relatively poorer noise figure if the means is amplifying the communication signal in the high linearity receiving mode in the gain state, and wherein the receiver has a relatively better noise figure if the means is amplifying the communication signal in the low linearity receiving mode in the gain state.

21. The apparatus of claim 18, wherein the lower gain in the high linearity receiving mode is associated with a degraded noise figure (NF) of the receiver.

22. The apparatus of claim 18, wherein the means for amplifying is a digital signal processor (DSP).

23. The apparatus of claim 18, further comprising:
    means for downconverting the amplified signal; and
    means for filtering the downconverted signal.

24. A processing system for processing a communication signal in a receiver, the processing system comprising a module configured to:
    detect the presence or the absence of jamming in the communication signal within a gain state; and
    amplify the communication signal in either a high linearity receiving mode or a low linearity receiving mode, based on detecting the presence or the absence of jamming in the communication signal, wherein the high linearity receiving mode corresponds with a lower gain for the gain state relative to that of the low linearity receiving mode, and wherein the communication signal is amplified in the high linearity receiving mode if the presence of jamming is detected.

25. A non-transitory machine-readable medium encoded with instructions for processing a communication signal in a receiver, the instructions comprising code for:
    controlling to amplify the communication signal in either a high linearity receiving mode or a low linearity receiving mode, based on a detection of the presence or the absence of jamming in the communication signal within a gain state, wherein the high linearity receiving mode corresponds with a lower gain for the gain state relative to that of the low linearity receiving mode, and wherein the controlling results in the communication signal being amplified in the high linearity receiving mode if the presence of jamming is detected.

26. An apparatus comprising:
a receiver operable in a selectable one of a plurality of receiver gain states, wherein in each of the receiver gain states the receiver is configurable to operate in a selectable one of a high linearity receiving mode and a low linearity receiving mode, wherein operation in the high linearity receiving mode of a selectable one of the receiver gain states results in the receiver having a relatively high noise figure, and wherein operation in the low linearity receiving mode of said selectable one of the receiver gain states results in the receiver having a relatively low noise figure; and
a jammer detector configured to detect the presence or the absence of jamming in a communication signal, wherein if the jammer detector detects the presence of jamming then the receiver is configured to operate in the high linearity mode without changing the receiver gain state whereas if the jammer detector detects the absence of jamming then the receiver is configured to operate in the low linearity mode without changing the receiver gain state.

27. The apparatus of claim 26, wherein the receiver involves a low noise amplifier and a downconverting mixer, wherein an output of the low noise amplifier is coupled to an input of the downconverting mixer without an intervening interstage SAW filter.

28. The apparatus of claim 26, wherein the receiver involves a low noise amplifier and a downconverting mixer, and wherein there is no interstage SAW filter in any signal path between the low noise amplifier and the downconverting mixer.

29. The apparatus of claim 26, wherein the receiver conforms with the IS-98 standard when operating in the low linearity receiving mode in each of the receiver gain states, and wherein the receiver conforms with the IS-98 standard when operating in the high linearity receiving mode in each of the receiver gain states.

30. The apparatus of claim 26, wherein the receiver conforms with the linearity and the noise figure specifications of the IS-98 standard, wherein the receiver involves a low noise amplifier and a downconverting mixer, and wherein there is no interstage SAW filter in any signal path between the low noise amplifier and the downconverting mixer.

31. The apparatus of claim 28, wherein the apparatus is a mobile telephone.

32. The apparatus of claim 31, wherein the mobile telephone is operable such that it communicates in compliance with an air interface standard promulgated as part of the CDMA2000 family of standards.

33. The apparatus of claim 31, wherein the mobile telephone is operable such that it communicates in compliance with a W-CDMA air interface standard.

34. The apparatus of claim 31, wherein the mobile telephone employs Code Division Multiple Access (CDMA).

35. The apparatus of claim 31, wherein the difference in receiver gain between receiver gain states is at least approximately 15 dB.

36. The apparatus of claim 26, wherein the jammer detector does not cause the receiver gain state to change.

37. A method comprising:
(a) operating a cellular telephone receiver in a receiver gain state such that a Low Noise Amplifier (LNA) of the receiver is configured in a first configuration;
(b) detecting the presence of a jammer;
(c) in response to the detecting of the jammer in (b) changing operation of the cellular telephone receiver so that the receiver operates in the receiver gain state such that the LNA of the receiver is configured in a second configuration, wherein operation of the receiver in the receiver gain state such that the LNA is configured in the first configuration results in the receiver having a relatively low linearity and a relatively better noise figure whereas operation of the receiver in the receiver gain state such that the LNA is configured in the second configuration results in the receiver having a relatively high linearity and a relatively poorer noise figure;
(d) detecting the absence of a jammer; and
(e) in response to the detecting of the absence of a jammer in (d) changing operation of the cellular telephone receiver so that the receiver operates in the receiver gain state such that the LNA of the receiver is configured in the first configuration.

38. The method of claim 37, wherein the receiver further comprises a downconverting mixer, wherein the LNA supplies an amplified communication signal to the downconverting mixer without the amplified communication signal passing through any interstage SAW filter.

39. The method of claim 38, wherein the receiver conforms with the IS-98 standard when operating in the receiver gain state when its LNA is configured in the first configuration, and wherein the receiver also conforms with the IS-98 standard when operating in the receiver gain state when its LNA is configured in the second configuration.

40. The method of claim 38, wherein the receiver can switch back and forth between having its LNA in the first configuration and having its LNA in the second configuration without changing receiver gain states, and without falling out of compliance with IS-98 standard linearity and noise figure specifications.

* * * * *